US011282707B2

(12) United States Patent
Tsai

(10) Patent No.: US 11,282,707 B2
(45) Date of Patent: Mar. 22, 2022

(54) METHOD AND SYSTEM OF ESTIMATING WAFER CRYSTALLINE ORIENTATION

(71) Applicant: TAIWAN SEMICONDUCTOR MANUFACTURING COMPANY LTD., Hsinchu (TW)

(72) Inventor: Bo-Tsung Tsai, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 29 days.

(21) Appl. No.: 16/842,673

(22) Filed: Apr. 7, 2020

(65) Prior Publication Data

US 2021/0074546 A1    Mar. 11, 2021

Related U.S. Application Data

(60) Provisional application No. 62/898,828, filed on Sep. 11, 2019.

(51) Int. Cl.
| | | |
|---|---|---|
| *H01L 21/265* | (2006.01) | |
| *H01L 21/66* | (2006.01) | |
| *H01J 37/317* | (2006.01) | |

(52) U.S. Cl.
CPC .... *H01L 21/26586* (2013.01); *H01J 37/3171* (2013.01); *H01L 22/12* (2013.01); *H01L 22/34* (2013.01)

(58) Field of Classification Search
None
See application file for complete search history.

(56) References Cited

U.S. PATENT DOCUMENTS

| 6,128,084 A | * | 10/2000 | Nanbu | G01N 21/21 |
| | | | | 250/225 |
| 2005/0161619 A1 | * | 7/2005 | Ray | H01J 37/3171 |
| | | | | 250/492.21 |
| 2015/0330918 A1 | * | 11/2015 | Kim | G01N 23/207 |
| | | | | 378/74 |
| 2020/0135470 A1 | * | 4/2020 | Huang | C23C 14/505 |

\* cited by examiner

*Primary Examiner* — Asok K Sarkar
(74) *Attorney, Agent, or Firm* — WPAT, P.C., Intellectual Property Attorneys; Anthony King

(57) ABSTRACT

A method includes: receiving a first wafer; defining a first zone and a second zone on the first wafer and a plurality of first areas; defining a plurality of first areas and second areas for the first and second zones, respectively; projecting first ion beams onto the first areas and receiving first thermal waves in response to the first ion beams; rotating the first wafer by a twist angle; projecting second ion beams onto the second areas and receiving second thermal waves in response to the second ion beams; and estimating a first crystalline orientation angle of the first wafer based on the first and second ion beams and the first and second thermal waves.

20 Claims, 9 Drawing Sheets

METHOD AND SYSTEM OF ESTIMATING WAFER CRYSTALLINE ORIENTATION

PRIORITY CLAIM AND CROSS-REFERENCE

This application claims priority to U.S. Provisional Application No. 62/898,828 filed Sep. 11, 2019, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In order to fabricate the advanced IC devices, ion implantation is extensively used to dope impurities into a workpiece, such as a semiconductor wafer, to form N-type or P-type wells. Using ion implantation, the amount of impurities in the workpiece is altered so as to introduce conductivity to the wells. A desired impurity material may be ionized by an ion source and accelerated to form an ion beam with prescribed energy. The ion beam may be directed to a front surface of the workpiece and penetrate into the bulk of the workpiece. The implanted ions may be distributed around a depth of the wafer area, and the distribution and concentration of the ions are controllable, such as through adjustment of the implantation angle and beam energy.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
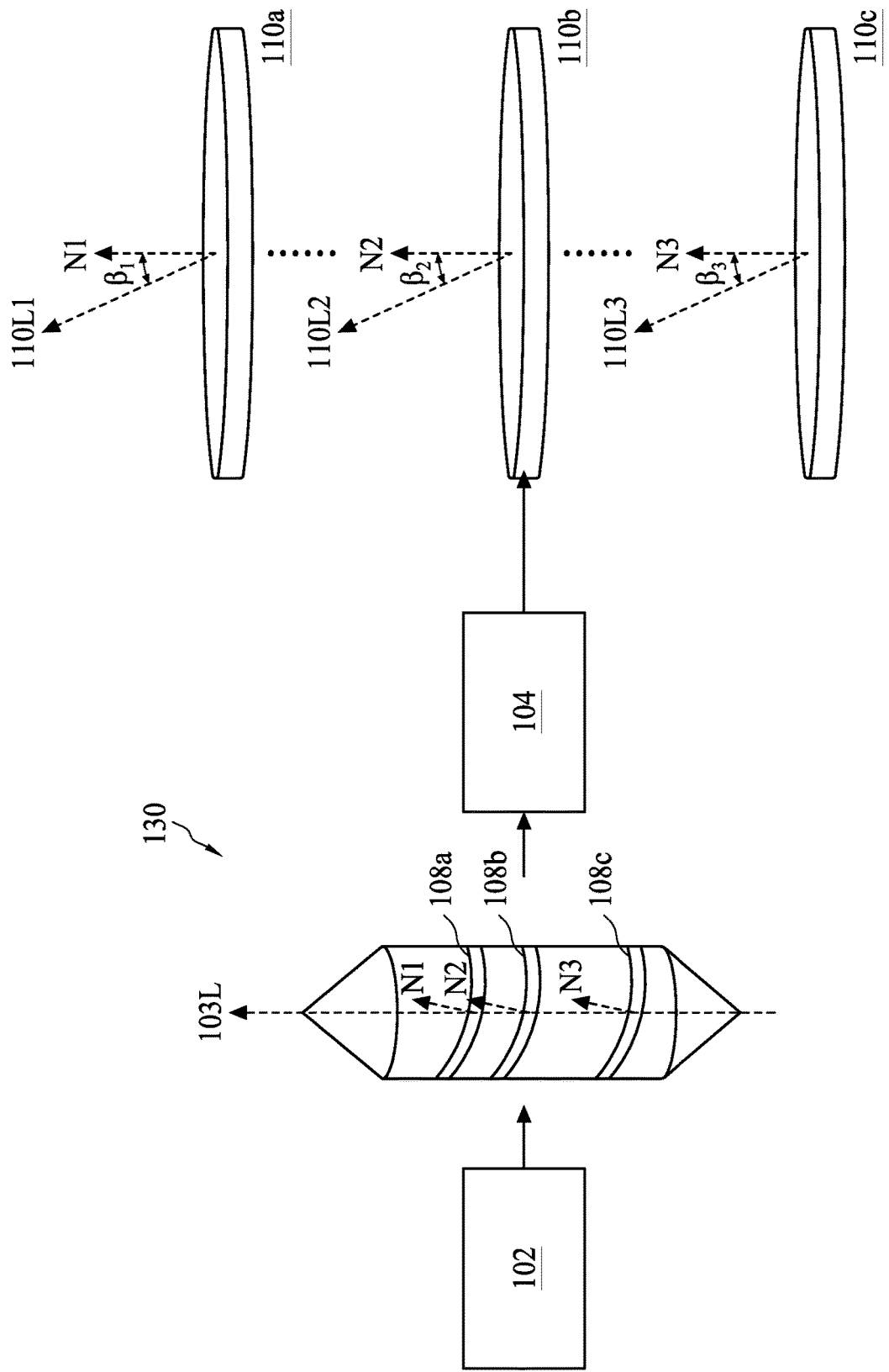
FIG. 1A is a schematic diagram showing a method of forming semiconductor wafers, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As will be appreciated by those skilled in the art, the embodiments of the present disclosure may be implemented as a system, method, or computer program product. Accordingly, the embodiments of the present disclosure may take the form of an entirely hardware embodiment, an entirely software embodiment (including firmware, resident software, micro-code, etc.) or an embodiment combining software and hardware aspects that may all generally be referred to herein as a "circuit," "block," "module" or "system." Furthermore, the embodiments of the present disclosure may take the form of a computer program product embodied in any tangible medium of expression having program codes embodied in the medium and executable by a computer.

A semiconductor wafer is used as a substrate of a semiconductor device in which doped regions may be formed in the bulk of the semiconductor wafer. A semiconductive ingot or wafer is formed with a crystalline lattice structure with parallel lattice planes. The lattice plane of the semiconductive ingot determines an angle of crystalline orientation (or lattice orientation) of the ingot or the semiconductor wafer. Generally, a semiconductive ingot is grown with a substantially equal angle of crystalline orientation throughout the ingot and the angular difference is usually negligible. However, as the size of the semiconductor device continues to decrease, the manufacturing of the semiconductor device needs to be performed with greater accuracy of operation parameters. Otherwise, the manufacturing operations performed with insufficient parameter accuracy will result in the issue of quality uniformity in the fabricated semiconductor devices.

In the present disclosure, a method and a system for estimating the crystalline orientation angle of a semiconductor wafer are provided. The estimation method is performed on a single test wafer. The proposed estimation method is more accurate than the alternative estimation method using multiple test wafers due to the elimination of the influence of angle variability among different test wafers. Further, the expense of test wafers is also reduced because only one test wafer is used per semiconductive ingot. The manufacturing operation, such as ion implantation, can be performed with greater accuracy of the projection angle that better matches the crystalline orientation angle of the semiconductor, and doped regions can be formed by ion implantation with a better profile control. The proposed method also reduces the cost of estimating the crystalline orientation angle of a group of wafers of a same lot, since a minimum of two test wafers, or only one test wafer, is required in some scenarios, thereby reducing the overhead of wafer quality control and improving the calibration efficiency of the crystalline orientation angles.

FIG. 1A is a schematic diagram showing a method 100 of forming semiconductor wafers, in accordance with some embodiments. The method 100 begins with a crystal growth operation 102. A semiconductive ingot 103 is formed accordingly. The semiconductive ingot 102 may be formed using any crystal growth method known in the art, such as the Czochralski (Cz) method. In some embodiments, the semiconductive ingot 103 is grown to include monocrystalline lattice structures. In some embodiments, the semiconductive ingot 103 is an ingot made of silicon or another suitable semiconductor material. After the silicon ingot 103 is formed, an operation 104 is performed to manufacture slices of semiconductor wafers 110, such as the semiconductor wafer 110a, 110b or 110c, from the semiconductive ingot 103. The operation 104 may include one or more wafer-forming procedures, such as slicing the semiconductive ingot 103 into raw wafers, and beveling, lapping, etching and polishing of the raw wafers to form completed semiconductor wafers 110. In some embodiments, the semiconductor wafers 110 belong to a same wafer lot if they are formed from the same semiconductive ingot 103. In some embodiments, the completed semiconductor wafer 110 has a diameter between about one inch and about 12 inches. In some embodiments, the completed semiconductor wafer 110 has a thickness between about 100 µm and about 500 µm.

In some embodiments, the semiconductor wafers 110 have similar crystal structures with a same crystalline orientation associated with a crystal plane, such as the (100), (110) or (111) crystal plane, since they are manufactured from a same semiconductive ingot 103. Regarding an ion implantation (also referred to as an ion beam projection) operation, the penetration depth and distribution of the implantation is at least partially determined by the included angle between the incident ion beams and the crystalline orientation angle of the lattice structure. As a result, the electrical behavior of a well region formed in the semiconductor wafer using the ion beam projection as well as a semiconductor device that includes the well region are influenced by the control accuracy of the crystalline orientation angle.

In some embodiments, each of the semiconductor wafers, e.g., semiconductor wafers 110a, 110b and 110c, has a respective normal line N1, N2 and N3 perpendicular to the surface of the semiconductor wafer 110a, 110b or 110c. Ideally, each semiconductor wafer 110a, 110b or 110c shares a same direction of crystalline orientation that is parallel to the longitudinal axis 103L of the semi conductive ingot 103 associated with a certain crystal plane (e.g., a (100) plane). However, in most cases, when the semiconductive ingot 103 is sliced, the cutting blade may not be exactly perpendicular to the longitudinal axis 103L. As a result, the normal line N1, N2 or N3 is not parallel to the directions of the respective crystalline orientation lines 110L1, 110L2 and 110L3. An included angle $\beta_1$, $\beta_2$ or $\beta_3$ between the directions of crystalline orientation lines 110L1, 110L2 or 110L3 and the respective normal lines N1, N2 or N3 is referred to herein as the crystalline orientation angle of the semiconductor wafer 110a, 110b or 110c. In some embodiments, the included angles $\beta_1$, $\beta_2$ and $\beta_3$ are substantially zero degrees.

In some embodiments, during crystal growth of the semiconductive ingot 103, the orientation of the crystal plane may rotate about the longitudinal axis 103L as the crystal lattice structure is grown upwardly. In other words, the actual crystalline orientation lines 110L1, 110L2 and 110L3 at the locations 108a, 108b and 108c, respectively, may point in slightly different directions. In addition, the included angles $\beta_1$, $\beta_2$ and $\beta_3$ may not be equal. In some embodiments, the rotation of the crystal plane during crystal growth is proportional to the grown height of the semiconductive ingot 103. Therefore, the included angles $\beta_1$, $\beta_2$ and $\beta_3$, or equivalently the crystalline orientation angles of the semiconductor wafers 110, are approximately represented by a linear equation. In some other embodiments, the included angle, e.g., $\beta_1$, or equivalently the crystalline orientation angle, of the semiconductor wafers 110 can be estimated by the included angles, e.g., $\beta_2$ and $\beta_3$, of two or more other semiconductor wafers 110 from the same semiconductive ingot 103.

Figure 1B:
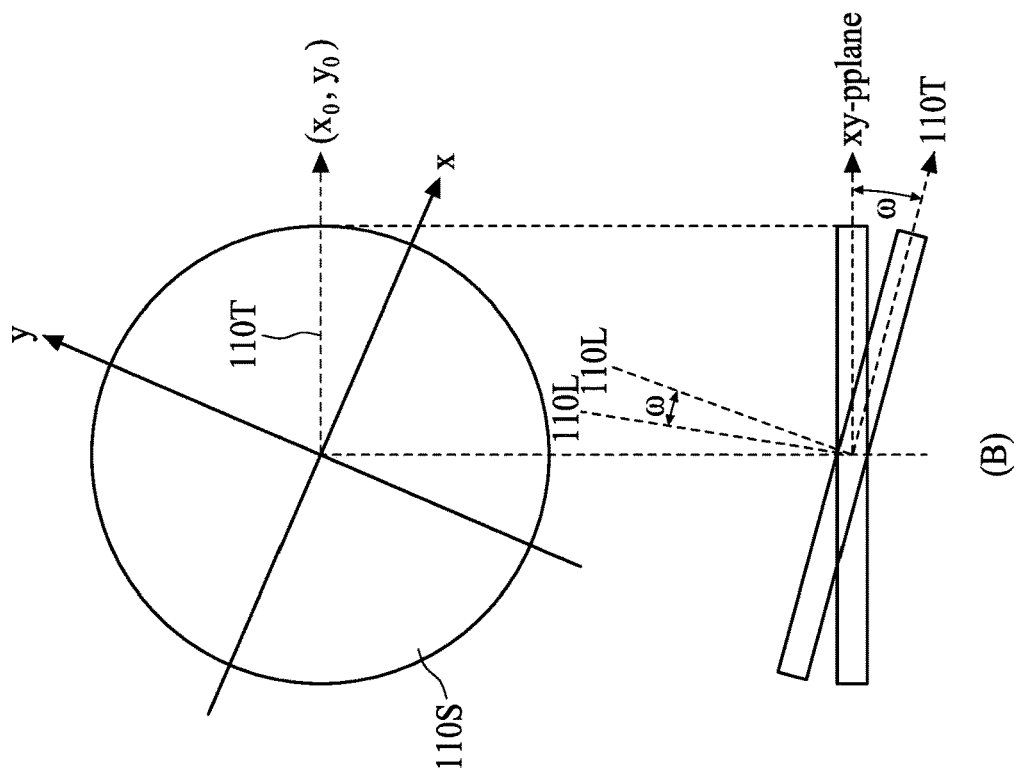
FIG. 1B is a schematic diagram showing an ion beam projecting onto a semiconductor wafer, in accordance with some embodiments.
Figure 1B:
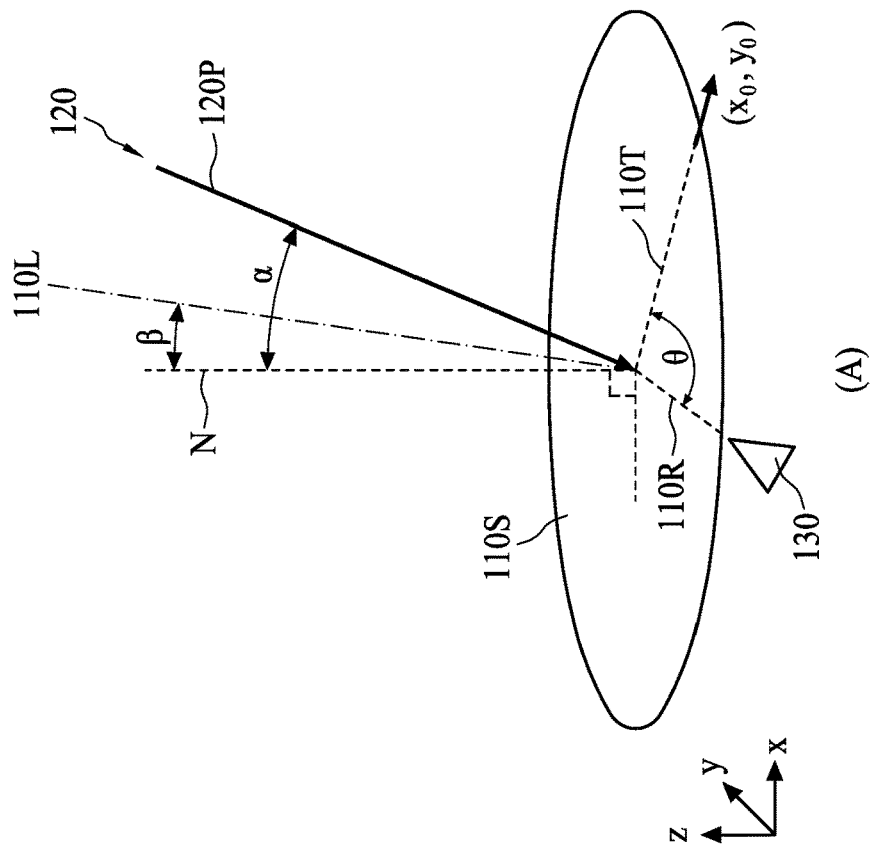

FIG. 1B is a schematic diagram showing an ion beam 120 projecting onto a semiconductor wafer 110, in accordance with some embodiments. Referring to plot (A) of FIG. 1B, the semiconductor wafer 110 is disposed with its surface 110S parallel to the xy-plane. Plot (A) of FIG. 1B also shows a normal line N extending in the direction of the z-axis and perpendicular to a surface 110S. In some embodiments, a crystal plane of the semiconductor wafer 110 may be non-parallel to the surface 110S of the semiconductor wafer 110, as illustrated by a crystalline orientation line 110L, which denotes the crystalline orientation of the semiconductor wafer 110. A crystalline orientation angle $\beta$ is formed between the normal line N and the crystalline orientation line 110L. As the semiconductor wafer 110 is rotated about the normal line N perpendicular to the xy-plane, the crystal plane and the crystalline orientation line 110L also revolve with the rotation of the semiconductor wafer 110. In some embodiments, the crystalline orientation line 110L revolves about the normal line N as the semiconductor wafer 110 rotates about the normal line N. A notch 130N serves as a reference point, and the semiconductor wafer 110 may be rotated from the notch 130 to a target coordinate $(x_0, y_0)$ by a rotated angle, an included angle or a center angle between a reference line 110T and a target line 110R is referred to herein as a twist angle θ, in which the reference line 110R is drawn from the center of the surface 110S to the notch 130N while the target line 110T is drawn from the center of the surface 110S to the target coordinate $(x_0, y_0)$. In some embodiments, the twist angle θ represents the change of the crystal plane orientation of the semiconductor wafer 110.

The ion beam 120 is projected by an ion implantation source (not separately shown), such as an implanter, used in an ion implantation operation. The ion beam 120 and the normal line N form an included angle α, referred to herein as a projection angle of the implanter. The ion beam 120 is projected along a path 120P onto a location, such as the center, of the surface 110S of the semiconductor wafer 110.

Referring to plot (B) of FIG. 1B, a top view and a side view of the semiconductor wafer 110 are shown. During an ion beam projection operation, the semiconductor wafer 110 may be tilted with a wafer tilt angle ω with respect to the xy-plane. In some embodiments, a wafer stage (not separately shown) that supports and holds the semiconductor wafer 110 is provided, wherein the wafer 110 is tilted by tilting the wafer stage. Assuming the target coordinate $(x_0, y_0)$ is selected as the tilting point, the semiconductor wafer 110 is tilted by tilting the wafer stage, in which the target line 110T associated with the target coordinate $(x_0, y_0)$ forms the wafer tilt angle ω with the xy-plane. The tilt angle ω may be positive or negative depending upon whether the target line 110T is above or below the xy-plane. In some embodiments, the direction of the crystalline orientation line 110L changes by the amount of the wafer tilt angle ω. Based on the above, the wafer tilt angle ω, the twist angle θ, and the projection angle α together determine the included angle between the ion beams 120 and the crystalline orientation line 110L of the semiconductor wafer 110, thereby determining the implantation angle of the ion beam 120 with respect to the semiconductor wafer 110.

In some embodiments, the angular difference (α−β) between the projection angle α of the ion beam 120 and the crystalline orientation angle β is one of the factors that determine the profile of implanted well regions. Further, the deviation of the well region profile is greater when the implanted well region has a reduced pitch, e.g., less than about one μm. For example, in applications of an advanced CMOS image sensor, a sensing pixel is formed with a pixel pitch of less than 0.8 μm. In such situations, one or more wells are implanted for forming the sensing pixel, in which the deviation of the impinging angle should be less than 0.05 degrees. As discussed previously, the actual impinging angle is determined by the crystalline orientation angle in addition to the implantation angle of the implanter. However, in a mass production process, it is difficult to have different lots of blank semiconductor wafers with equal crystalline orientation angles. Even the same lot of semiconductor wafers, e.g., the semiconductor wafers 110 in FIG. 1A, manufactured from the same semiconductive ingot 103, still include a maximal angle deviation of crystalline orientation angle of about 0.1 degrees across the entire height of the semiconductive ingot 103, which exceeds the accuracy tolerance of the advanced CMOS image sensor. Therefore, there is a need to provide an accurate estimation of the crystalline orientation angle to eliminate or reduce the interference of crystalline orientation angle variability.

Figure 2:
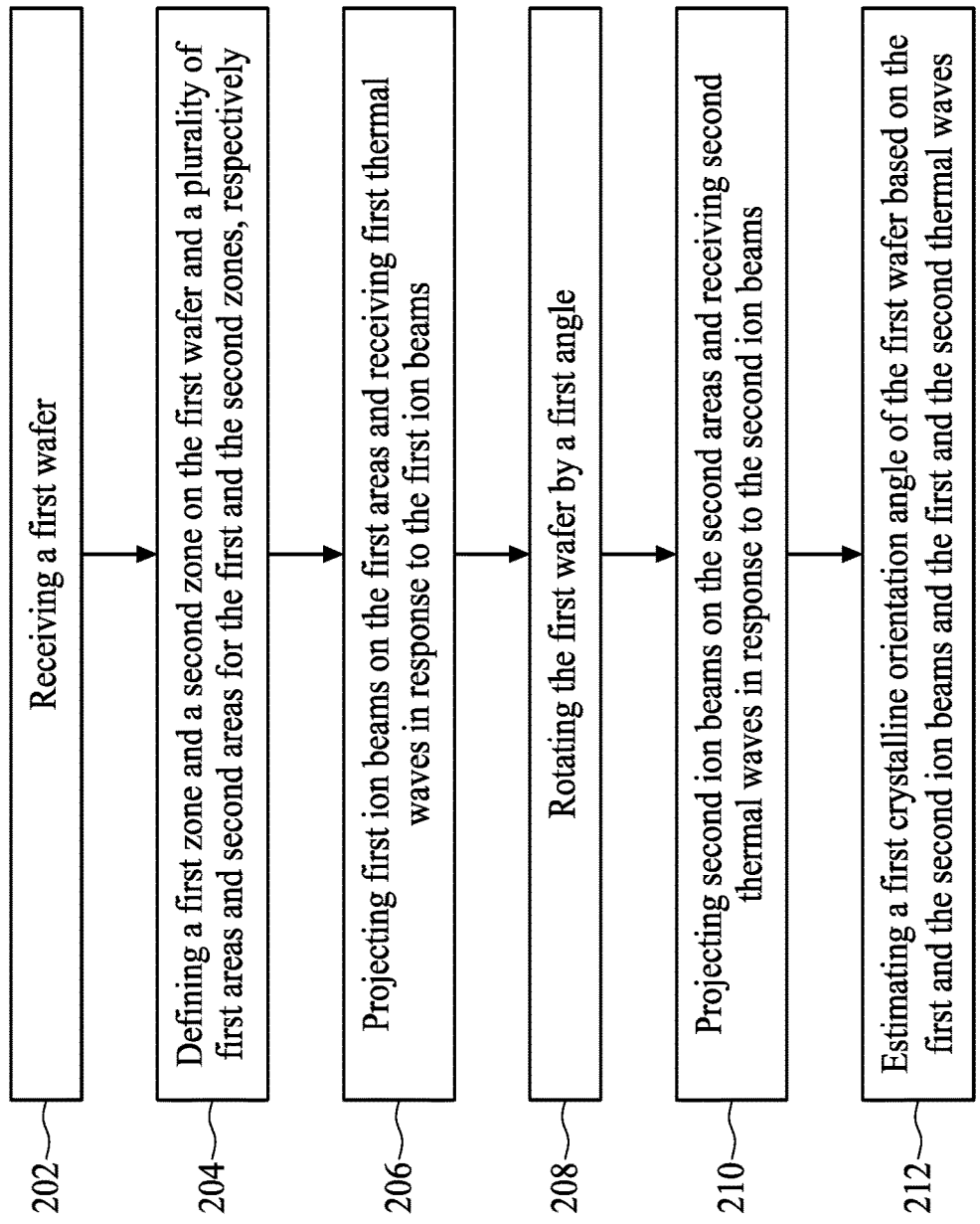
FIG. 2 is a flowchart of a method of estimating a crystalline orientation angle of a semiconductor wafer, in accordance with some embodiments.

FIG. 2 is a flowchart of a method 200 of estimating a crystalline orientation angle of a semiconductor wafer, in accordance with some embodiments. It should be understood that additional steps can be provided before, during, and after the steps shown in FIG. 2, and some of the steps described below can be replaced or eliminated in other embodiments of the method 200. The order of the steps may be interchangeable.

Figure 3:
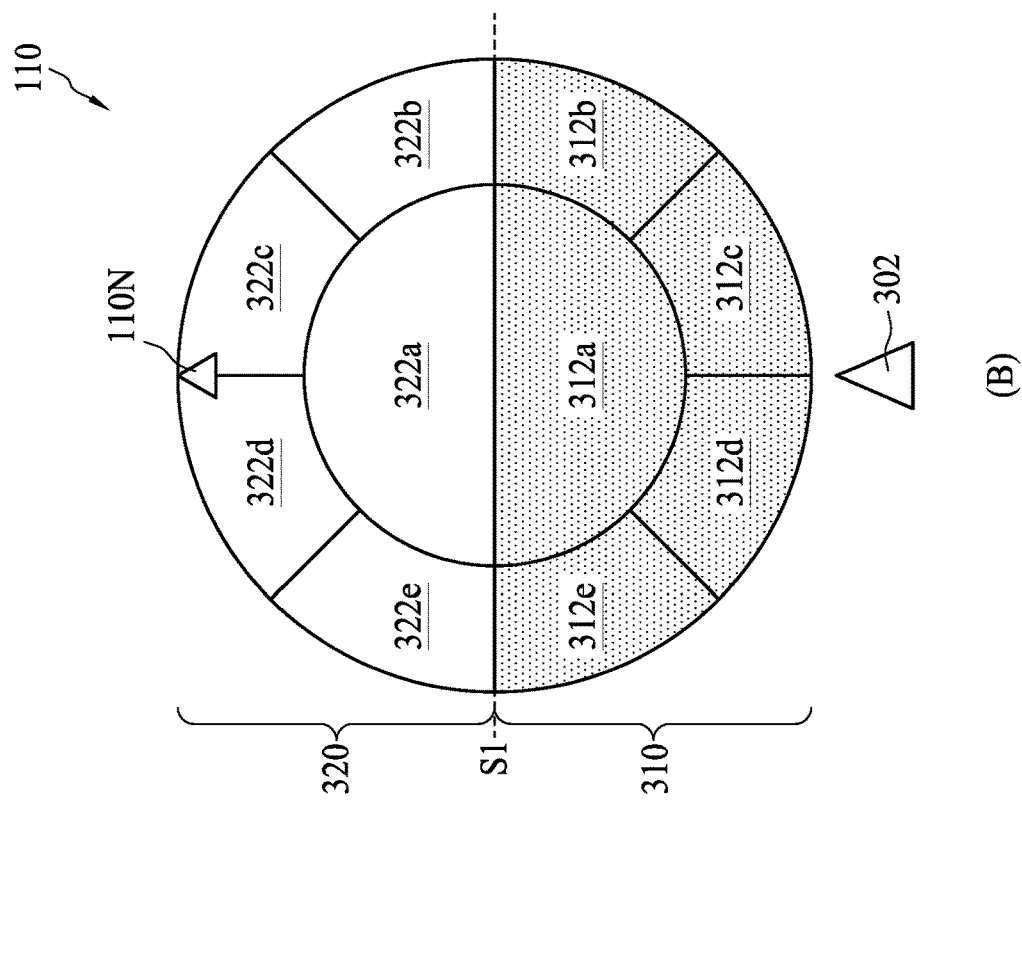
FIG. 3 is a schematic diagram showing a surface of a semiconductor wafer with partitioned zones, in accordance with some embodiments.
Figure 3:
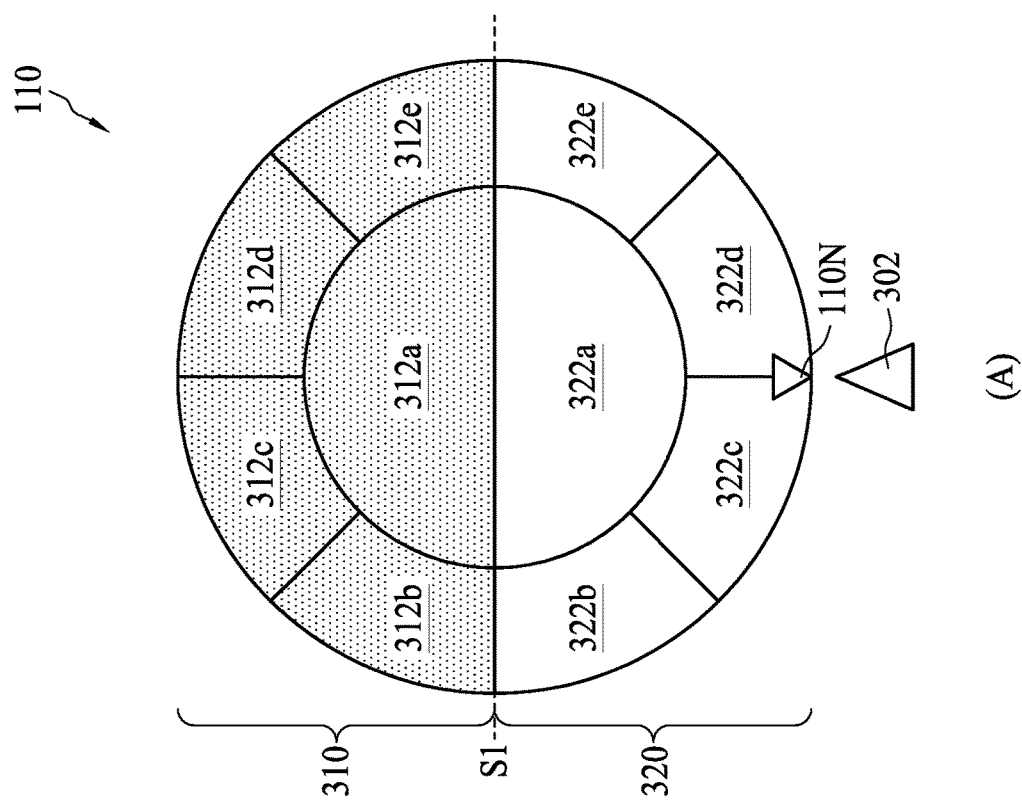

At step 202, a first wafer 110 is received. The first wafer 110 is also shown in FIG. 3. In some embodiments, the first wafer 110 is selected from a wafer lot and serves as a test wafer of the wafer lot. In some embodiments, the first wafer 110 is disposed on a wafer stage or platen (not separately shown). In some embodiments, a notch HON is formed or marked on the first wafer. A marker 302, which points to the notch 110N of the first wafer 110, serves a reference point of the first wafer 110 with respect to the notch 110N when the first wafer 110 is rotated by the wafer stage.

At step 204, as illustrated in plot (A) of FIG. 3, a first zone 310 and a second zone 320 are defined on the first wafer 110. Further, a plurality of first areas 312, e.g., first areas 312a, 312b, 312c, 312d, and 312e, and a plurality of second areas 322, e.g., second areas 322a, 322b, 322c, 322d and 322e, are defined in the first and second zones, respectively. In some embodiments, the first zone 310 and the second zone 320 represent two halves of the first wafer 110. In some embodiments, the first zone 310 and the second zone 320 are symmetrical to each other with respect to a symmetry line S1. In some embodiments, the first zone 310 and the second zone 320 have substantially equal areas, each of which is equal to one half of the total area of the first wafer 110. In some embodiments, the first zone 310 abuts the second zone 320; however, in some other embodiments, the first zone 310 and the second zone 320 are separated by a third zone between the first zone 310 and the second zone 320, and the first zone 310 and the second zone 320 each has an area less than one half of the total area of the first wafer 110. In the depicted embodiment, the first zone 310 or the second zone 320 has a semicircular shape; however, other shapes such as a polygonal shape or a circular shape are also possible. The shapes and areas of the first zone 310 and the second zone 320 shown in plot (A) of FIG. 3 are for illustrational purposes. Other configurations of the first zone 310 and the second zone 320 are also within the contemplated scope of the present disclosure.

The first areas 312 are defined in the first zone 310. The second areas 322 are defined in the second zone 320. In some embodiments, the first areas 312 have different shapes or areas. For example, the first area 312a has a semicircular shape, and each of the remaining first areas 312b, 312c, 312d and 312e has an arc shape; however, other shapes such as polygonal shapes, pie shapes, or circular shapes are also possible. In some embodiments, the first area 312a abuts the remaining first areas 312b, 312c, 312d and 312e. The first area 312a may be laterally surrounded by the first areas 312b, 312c, 312d and 312e and the second area 322a of the second zone 320. In some embodiments, the first areas 312a through 312e abut each other. In some embodiments, the first areas 312a through 312e are spaced apart from each other. In the depicted example, the first zone 310 is partitioned into five first areas 312a through 312e. However, other numbers of the first areas 312 are also possible.

In some embodiments, the second areas 322 have different shapes or areas. For example, the second area 322a has a semicircular shape, and each of the remaining second areas 322b, 322c, 322d and 322e has an arc shape; however, other shapes such as polygonal shapes, pie shapes or circular shapes are also possible. In some embodiments, the second area 322a abuts the remaining second areas 322b, 322c, 322d and 322e. The second area 322a may be laterally surrounded by the second area 322b, 322c, 322d and 322e and the first area 312a of the first zone 310. In some embodiments, the second areas 322a through 322e abut each other. In some embodiments, the second areas 322a through 322e are spaced apart from each other. In the depicted example, the second zone 320 is partitioned into five second areas 322a through 322e. However, other numbers of the second areas 322 are also possible.

In some embodiments, one of the first areas 312, e.g., the first area 312a, and one of the second area 322, e.g., the second area 322a, are paired. In some embodiments, the paired first area 312a and second area 322a are symmetrical with respect to the symmetry line S1. In some embodiments, the paired first area 312a and second area 322a have identical areas and shapes. Similarly, the first area 312b (312c, 312d or 312e) is paired with the second area 322b (322c, 322d or 322e), and the first area 312b (312c, 312d or 312e) and the second area 322b (322c, 322d or 322e) are symmetrical with respect to the symmetry line S1.

Figure 4:
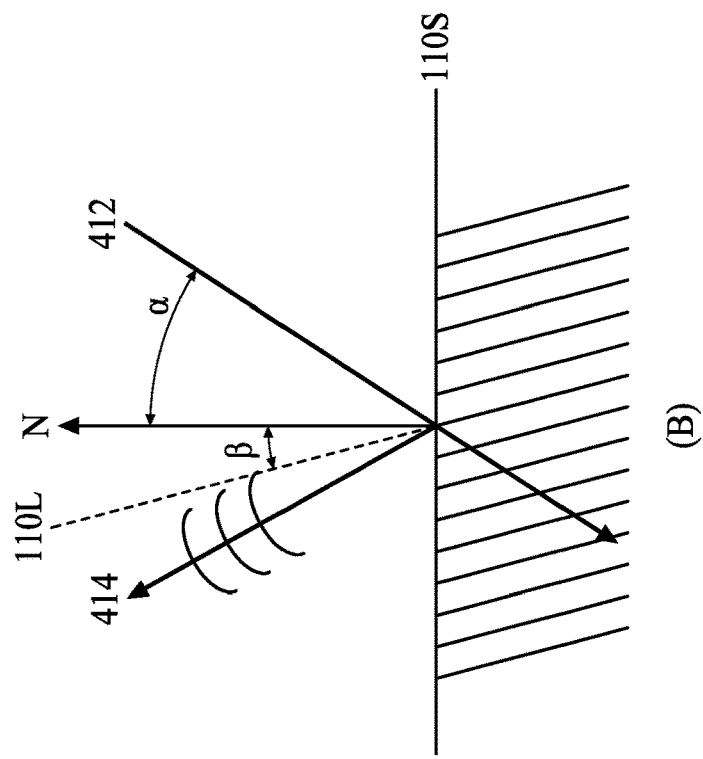
FIG. 4 is a schematic diagram showing ion beam projection, in accordance with some embodiments.
Figure 4:
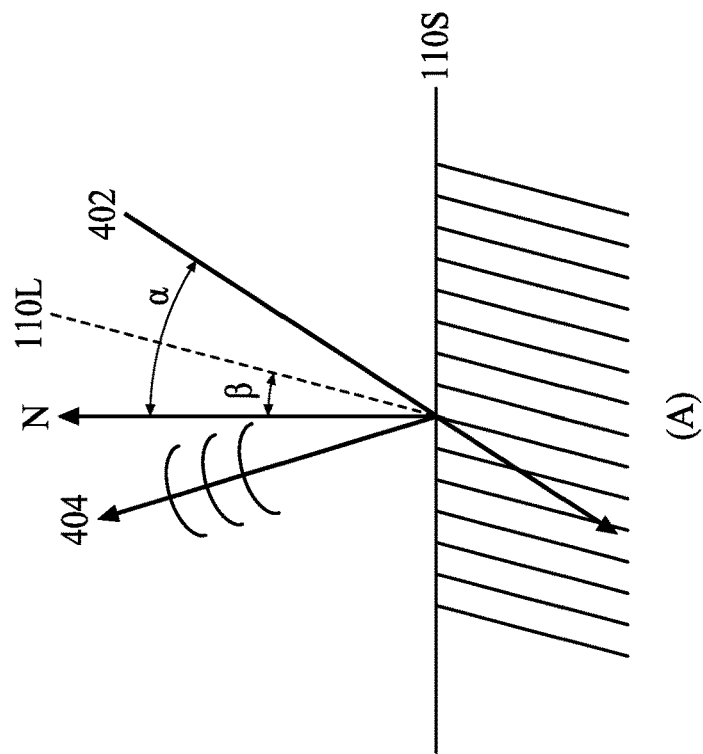

At step 206, a first ion beam projection is performed in which first ion beams 402 are projected onto the first areas 312, as illustrated in plot (A) of FIG. 4. First thermal waves 404 are received in response to the first ion beams 402. In some embodiments, the implanter is configured to project individual first ion beams 402 onto the individual first areas 312 one at a time, in which each of the first ion beams 402 is projected at different times with identical energies and the same implantation angle α, and each of the individual first areas 312 receives the individual first ion beam 402 with a respective wafer tilt angle ω. In some embodiments, the implanter projects the first ion beams 402 repeatedly with different tilt angles ω, in which the tilt angles ω have an angular difference $K_1$. For example, the angular difference $K_1$ is 0.2°, and the implanter is configured to project a first ion beam 402 five times for the first areas 311a through 311e with the respective wafer tilt angles ω of −0.4 degrees, −0.2 degrees, 0 degrees, 0.2 degrees, and 0.4 degrees. In some embodiments, the second zone 320 is prevented from receiving the first ion beams 402 during the first ion beam projection.

When the first ion beams 402 are projected onto the surface 110S of the first wafer 110, the ionized particles in the first ion beams 402 are accelerated by the implanter and penetrate into the interior lattice structure of the first wafer 110. A portion of the ionized particles of first ion beams 402 collide with the atoms in the lattice structure and generate first thermal waves 404 that propagate outwardly. A thermal wave detector, such as a thermometer, is used to receive the first thermal waves 404 resulting from the collision of the first ion beams 402 and the lattice structure. The intensity or temperature of the first thermal waves 404 is determined by the extent of collision, which is related to the actual impinging angle of the first ion beams 402. Since the first ion beams 402 are projected onto the individual first areas 312 with different wafer tilt angles ω, the first thermal waves 404 for the different instances of wafer tilt angle ω have different wave intensities.

In some embodiments, the first ion beam 402 impinges onto the respective first area 312 at an impinging angle represented as an angular difference (α−β) assuming the wafer tilt angle ω of zero degrees. By tuning the wafer tilt angle ω, the actual impinging angle can be made less than (α−β) in order to achieve greater ion penetration and less collision between the ionized particles and the lattice atoms, and thus cause the respective first thermal wave 414 to have decreased wave intensity. In some embodiments, when the wafer tilt angle ω is tuned to compensate for the included angle (α−β) between the implantation angle α and the crystalline orientation angle β, the first ion beams 402 hit the crystal plane at a smallest impinging angle (substantially zero degrees), resulting in a minimal wave intensity of the first thermal waves 404.

At step 208, referring also to plot (B) of FIG. 3, the first wafer 110 is rotated by a twist angle θ using the wafer stage. In some embodiments, the twist angle θ is set as 180 degrees; however, other values of the twist angle θ are also possible. In the embodiment where the twist angle θ is set as 180 degrees, the first wafer 110 is rotated by 180 degrees, thereby causing the notch 110N to face away from the marker 302, and the relative locations of the first areas 312a through 312e and the second areas 312a through 312e are interchanged with respect to the symmetry line S1.

At step 210, referring also back to plot (B) of FIG. 4, a second ion beam projection is performed in which second ion beams 412 are projected onto the second areas 322. Second thermal waves 414 are received in response to the second ion beams 412. In some embodiments, the implanter is configured to project individual second ion beams 412 onto the individual second areas 322 one at a time, in which each of the second ion beams 412 is projected at different times with identical energies and the same implantation angle α, and each of the individual second areas 322 receives the individual second ion beam 412 with a respective wafer tilt angle ω. In some embodiments, the first ion beams 402 and the second ion beams 412 have identical implantation energies and implantation angles α. In some embodiments, the wafer tilt angles ω are have an angular difference $K_2$. For example, the angular difference $K_2$ is 0.2°, and the implanter is configured to project five second ion beams 422 onto the second areas 322a through 322e with the respective wafer tilt angles −0.4 degrees, −0.2 degrees, 0 degrees, 0.2 degrees, and 0.4 degrees. In some embodiments, the angular difference $K_1$ is same as or different form the angular difference $K_2$. In some embodiments, the first zone 310 is prevented from receiving the ion beams 422 during the second ion beam projection.

When the second ion beams 412 are projected onto the surface 110S of the first wafer 110, the ionized particles in the second ion beams 412 are accelerated by the implanter and penetrate into the interior lattice structure of the first wafer 110. A portion of the ionized particles of the second ion beams 412 collide with the atoms in the lattice structure and generate second thermal waves 414 that propagate outwardly. A thermal wave detector, such as a thermometer, is used to receive the second thermal waves 414 resulting from the collision of the second ion beams 412 and the lattice structure. The intensity or temperature of the second thermal waves 414 is determined by the extent of collision, which is related to the actual impinging angle of the second ion beams 412. Since the second ion beams 412 are projected onto the individual second areas 322 at different wafer tilt angles ω, the second thermal waves 414 for the different wafer tilt angles ω have different wave intensities.

Referring to plots (A) and (B) of FIG. 4, the crystalline orientation angles β and −β are differentiated by a sign due to the rotation of the first wafer 110 by a twist angle θ of 180 degrees. In some embodiments, assuming a wafer tilt angle ω of zero degrees, the second ion beam 412 impinges onto the second areas 322 at an impinging angle of (α+β). By tuning the wafer tilt angle ω, the actual impinging angle can be made less than (α+β) to achieve greater ion penetration and less collision between the ionized particles and the lattice atoms, thus reducing the wave intensity of the respective second thermal wave 414. In some embodiments, when the wafer tilt angle ω is tuned to compensate for the included angle (α+β), the second ion beams 404 hit the crystal plane at a smallest impinging angle (substantially zero degrees), resulting in a minimal wave intensity of the second thermal waves 414.

Figure 5:
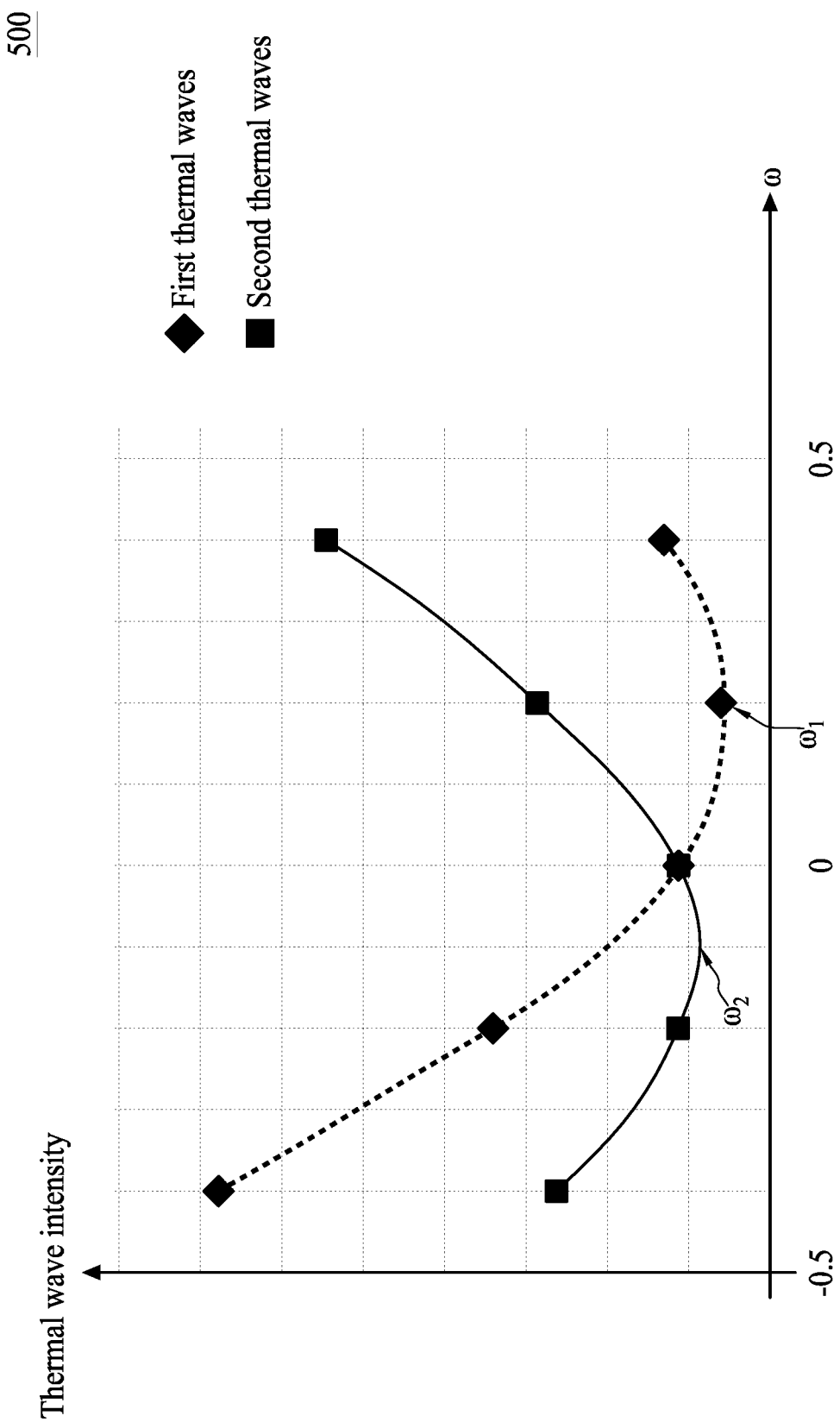
FIG. 5 is a schematic graph illustrating the thermal wave intensity s the wafer tilt angle, in accordance with some embodiments.

At step 212, a first crystalline orientation angle β of the first wafer 110 is estimated based on the first ion beams 402, the second ion beams 412, the first thermal waves 404 and the second thermal waves 414. In some embodiments, the implantation angle of the implanter is also estimated based on the first ion beams 402, the second ion beams 412, the first thermal waves 404 and the second thermal waves 414. Referring to FIG. 5, a schematic graph 500 illustrates the thermal wave intensity versus the wafer tilt angle ω, in accordance with some embodiments. The intensities of the first thermal waves 404 and the second thermal waves 414 are plotted on the graph 500. The diamond markers denote the intensities of the first thermal waves 404 at different wafer tilt angles ω and the square markers denote the intensities of the second thermal waves 414 at different wafer tilt angles ω.

A curve fitting operation is performed to generate a curve that best fits the measurements of the first thermal waves 404, as shown by the dashed line. Similarly, another curve fitting operation is performed to generate a curve that best fits the measurements of the second thermal waves 414, as shown by the solid line. Subsequently, a wafer tilt angle $\omega_1$ is determined which attains a minimum intensity of the first thermal waves 404. Similarly, another wafer tilt angle $\omega_2$ is determined which attains a minimum intensity of the second thermal waves 414. In some embodiments, the value of the wafer tilt angles $\omega_1$ or $\omega_2$ is determined by solving an equation that describes the curve of the first thermal waves 404 or the second thermal waves 414.

As discussed previously, the wafer tilt angle $\omega_1$ that leads to the minimal wave intensity of the first thermal waves 404 corresponds to the angular difference (α−β) while the wafer tilt angle $\omega_2$ that leads to the minimal wave intensity of the second thermal waves 414 corresponds to the angular difference (α+β). Therefore, the values of the implantation angle α and the crystalline orientation angle β can be estimated through linear algebra, and can be represented as follows.

$$\alpha=(\omega_1+\omega_2)/2$$

$$\beta=(\omega_2-\omega_1)/2$$

Figure 6:
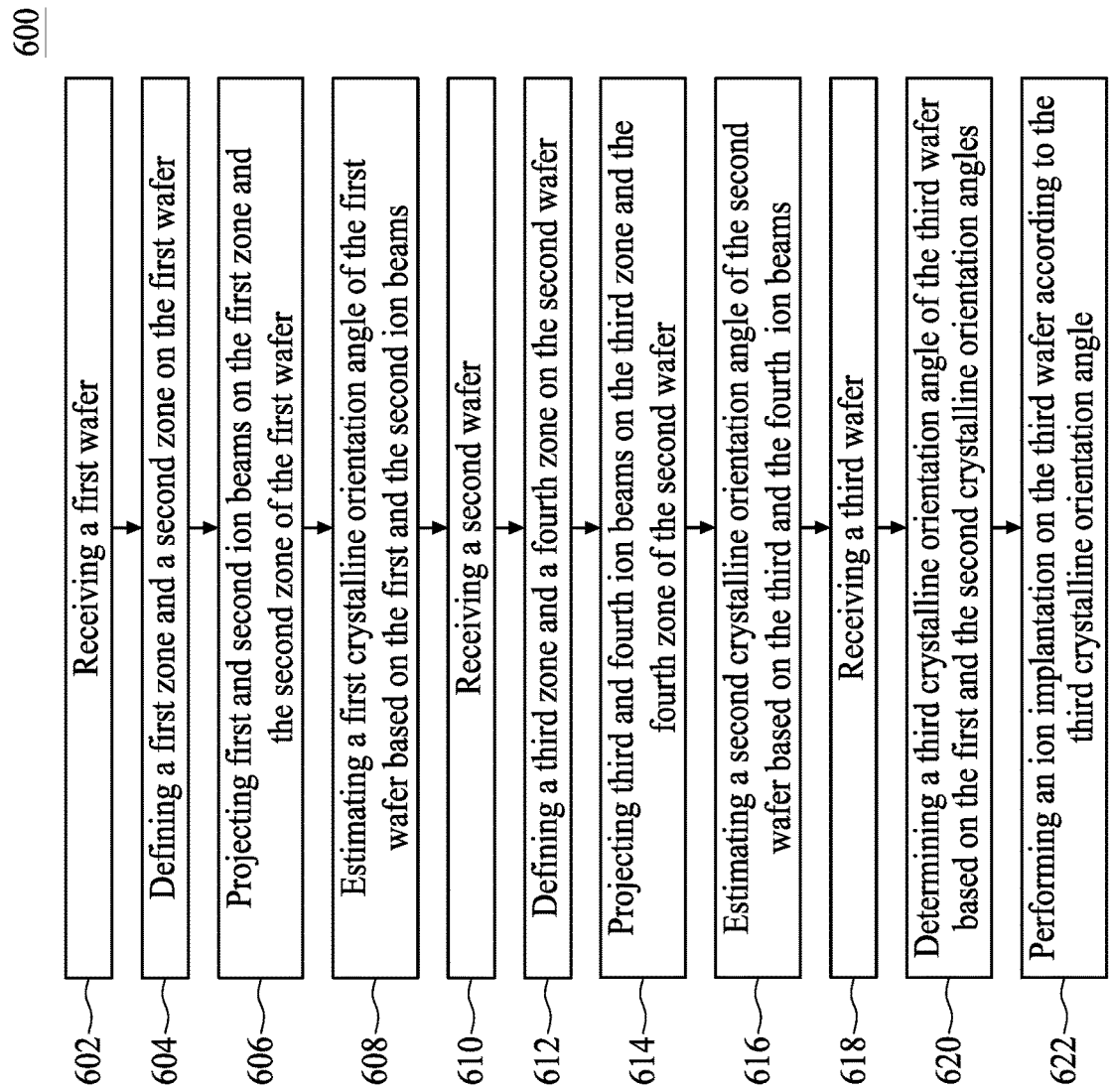
FIG. 6 is a flowchart of a method of estimating a crystalline orientation angle of a semiconductor wafer, in accordance with some embodiments.

FIG. 6 is a flowchart of a method 600 of manufacturing semiconductor devices, in accordance with some embodiments. It should be understood that additional steps can be provided before, during, and after the steps shown in FIG. 6, and some of the steps described below can be replaced or eliminated in other embodiments of the method 600. The order of the steps may be interchangeable.

At step 602, a first wafer is received. In some embodiments, the first wafer is the wafer 110a in FIG. 1A and the wafer 110 in FIG. 3 and FIG. 4. At step 604, a first zone and a second zone are defined on the first wafer. In some embodiments, the first zone and the second zone are the first zone 310 and the second zone 320 in FIG. 3. In some embodiments, first areas 312 are defined in the first zone 310 and second areas 322 are defined in the second zone 320.

At step 606, a first ion beam projection and a second ion beam projection are performed in which first and second ion beams are projected, by the respective first and second ion beam projections, onto the first zone and the second zone, respectively, of the first wafer. In some embodiments, the first ion beams and the second ion beams are the first ion beams 402 and the second ion beams 412, respectively. In some embodiments, the first areas and the second areas receive the first ion beam projection and the second ion beam projection, respectively, with respective implanter tilt angles. In some embodiments, first thermal waves and second thermal waves are received in response to the first ion beam projection and the second ion beam projection, respectively. In some embodiments, the first or second ion beam projection in step 606 is performed in a manner similar to that of steps 206, 208 and 210.

At step 608, a first crystalline orientation angle of the first wafer is estimated based on the first and second ion beams. In some embodiments, the first crystalline orientation angle of the first wafer is estimated further based on the first thermal waves and the second thermal waves. In some embodiments, the implantation angle of the implanter is also estimated at step 608 based on the first ion beams, the second ion beams, the first thermal waves and the second thermal waves. In some embodiments, the estimation of first crystalline orientation angle of the first wafer and the implantation angle of the implanter in step 608 is performed in a manner similar to that of step 212.

At step 610, a second wafer is received. In some embodiments, the second wafer is the wafer 110b in FIG. 1A and the wafer 110 in FIG. 3 and FIG. 4. In some embodiments, the first wafer and the second wafer are test wafers. In some embodiments, the first wafer and the second wafer are manufactured from a same semiconductive ingot and are separated in the semiconductive ingot by one or more other wafers. In some embodiments, the first wafer and the second wafer belong to a same wafer lot and are separated by one or more other wafers.

At step 612, a third zone and a fourth zone are defined on the second wafer. In some embodiments, the third zone and the fourth zone are the first zone 310 and the second zone 320 in FIG. 3. In some embodiments, first areas 312 are defined in the first zone 310 and second areas 322 are defined in the second zone 320.

At step 614, a third ion beam projection and a fourth ion beam projection are performed in which third and fourth ion beams are projected, by the respective third and fourth ion beam projections, onto the third zone and the fourth zone, respectively, of the second wafer. In some embodiments, the third ion beams and the fourth ion beams are the first ion beams 402 and the second ion beams 412, respectively. In some embodiments, the first areas 312 and the second areas 322 of the second wafer receive the third ion beam projection and the fourth ion beam projection, respectively, with respective implanter tilt angles. In some embodiments, third thermal waves and fourth thermal waves are received in response to the third ion beam projection and the fourth ion beam projection, respectively. In some embodiments, the third or fourth ion beam projection in step 614 is performed in a manner similar to that in steps 206, 208 and 210.

At step 616, a second crystalline orientation angle of the second wafer is estimated based on the third and fourth ion beams. In some embodiments, the second crystalline orientation angle of the second wafer is estimated further based on the third thermal waves and the fourth thermal waves. In some embodiments, the implantation angle of the implanter is also estimated at step 616 based on the third ion beams, the fourth ion beams, the third thermal waves and the fourth thermal waves. In some embodiments, the estimation of the second crystalline orientation angle of the second wafer and the implantation angle of the implanter by step 616 is performed in a manner similar to that of step 212.

At step 618, a third wafer is received. In some embodiments, the third wafer is a wafer prepared for manufacturing a semiconductor device. In some embodiments, the third wafer is manufactured from a semiconductive ingot from which the first and second wafers are manufactured. In some embodiments, the third wafer belongs to a same wafer lot as the first and second wafers. In some embodiments, the third wafer is in a location of the semiconductive ingot between the first wafer and the second wafer.

At step 620, a third crystalline orientation angle of the third wafer is determined based on the first and second crystalline orientation angles. In some embodiments, the third crystalline orientation angle of the third wafer is determined by interpolation or extrapolation of the first crystalline orientation angle and the second crystalline orientation angle based on the distances among the first wafer, second wafer and the third wafer in the semiconductive ingot. In some embodiments, the third crystalline orientation angle of the third wafer is an arithmetic average of the first wafer crystalline orientation angle and the second wafer crystalline orientation angle. In some embodiments, a fourth crystalline orientation angle of a fourth wafer in the same semiconductive ingot is received, and the third crystalline orientation angle of the third wafer is determined based on the first, second and fourth crystalline orientation angles, e.g., through a suitable approximation method, such as curve fitting or linear regression.

In some embodiments, the implanter used for performing the ion beam projection in steps 606 and 614 is the same implanter, and the final implantation angle of the implanter is determined based on the results of the estimation of the implantation angle of the implanter performed in steps 608 and 616. In some embodiments, the final implantation angle is determined by averaging the results of the estimation of the implantation angle for the first wafer and the second wafer performed in steps 608 and 616.

At step 622, an ion implantation is performed on the third wafer according to the third crystalline orientation angle. In some embodiments, the third wafer is not a test wafer and the ion implantation is performed to manufacture a well region in the third wafer for fabricating a semiconductor device. In some embodiments, the ion implantation is performed on the third wafer according to the implantation angle of the implanter.

Figure 7:
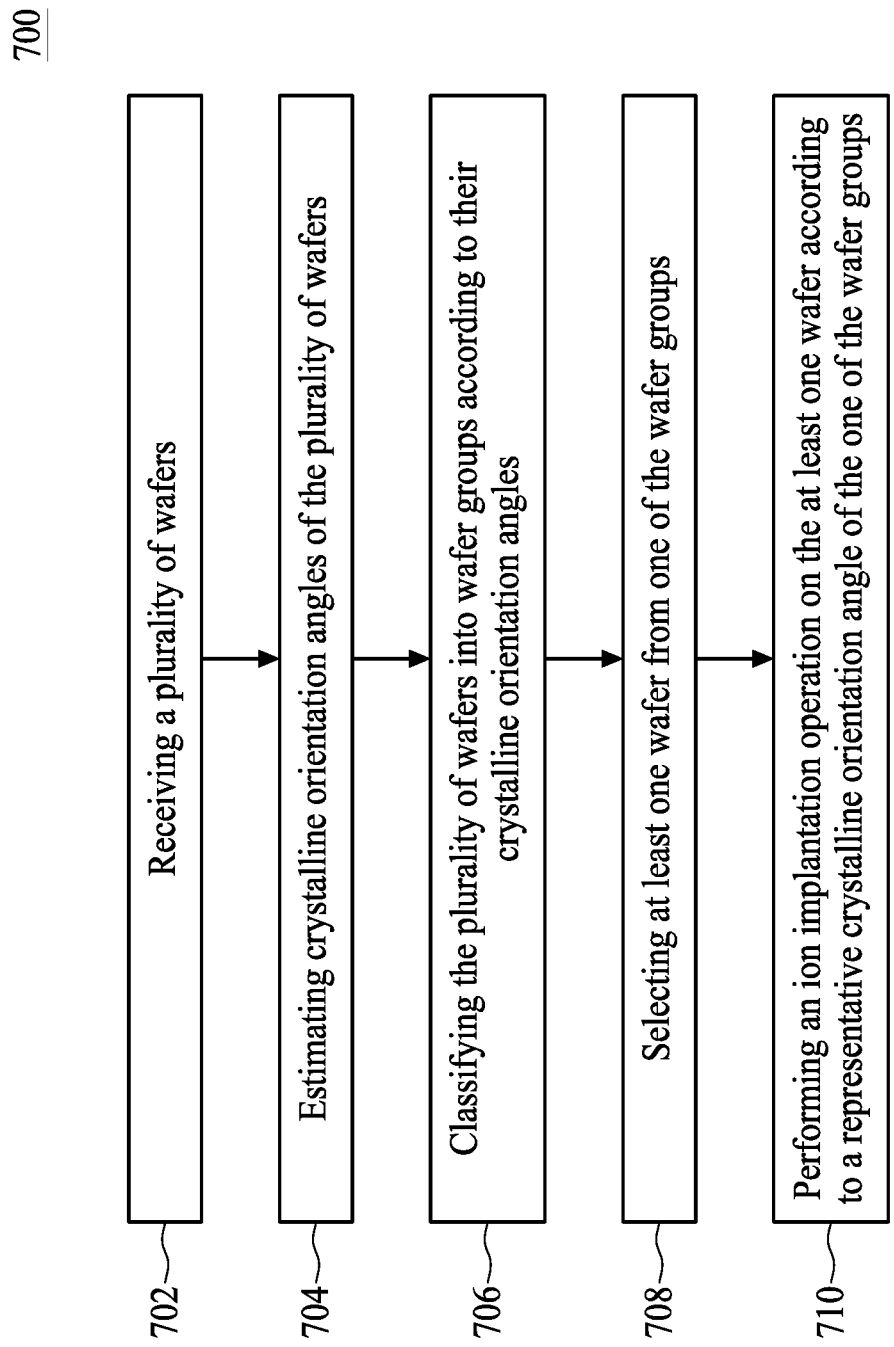
FIG. 7 is a flowchart of a method of manufacturing semiconductor devices, in accordance with some embodiments.

FIG. 7 is a flowchart of a method 700 of manufacturing semiconductor devices, in accordance with some embodiments. It should be understood that additional steps can be provided before, during, and after the steps shown in FIG. 7, and some of the steps described below can be replaced or eliminated in other embodiments of the method 700. The order of the steps may be interchangeable.

At step 702, a plurality of wafers are received. In some embodiments, the plurality of wafers belong to a same wafer lot or different wafer lots. In some embodiments, the plurality of wafers are manufactured from a same semi conductive ingot or from different semiconductive ingots. At step 704, crystalline orientation angles of the plurality of wafers are estimated. In some embodiments, the crystalline orientation angle of each of the plurality of wafers is determined using method 200, in which the crystalline orientation angle is estimated at step 212, or using method 600, in which the crystalline orientation angle is estimated at step 602 based on the crystalline orientation angles of other wafers. In some embodiments, the crystalline orientation angle is estimated by another suitable method. In some embodiments, an implantation angle of an implanter is also estimated at step 704. In some embodiments, the plurality of wafers include one or more test wafers, and the crystalline orientation angles of the test wafers are estimated. The crystalline orientation angles of the rest of the plurality of wafers are determined based on the estimated crystalline orientation angles of the test wafers.

At step 706, the plurality of wafers, excluding the test wafers if any, are classified into more than one wafer groups according to their crystalline orientation angles. In some embodiments, each wafer group is identified by a representative crystalline orientation angle. In some embodiments, the number of wafer groups is determined based on the granularity of the classified crystalline orientation angles. A smaller standard deviation of the crystalline orientation angles of the wafers in a wafer group may require more wafer groups that result in a more accurate representative crystalline orientation angle for each wafer group. The wafers in each wafer group may come from the same or different semiconductive ingots.

At step 708, at least one wafer from a certain wafer group is selected. At step 710, an ion implantation operation is performed on the at least one selected wafer. In some embodiments, the ion implantation operation is performed using the implanter according to the estimated tilt angle of the implanter and the representative crystalline orientation angle of the wafer group from which the at least one wafer is selected. Since the selected wafers share a common representative crystalline orientation angle, the ion implantation operation can be performed with a more accurate tilt angle with respect to these wafers by minimizing or eliminating the variability of crystalline orientation angles between different wafers in a mass production procedure.

Figure 8:
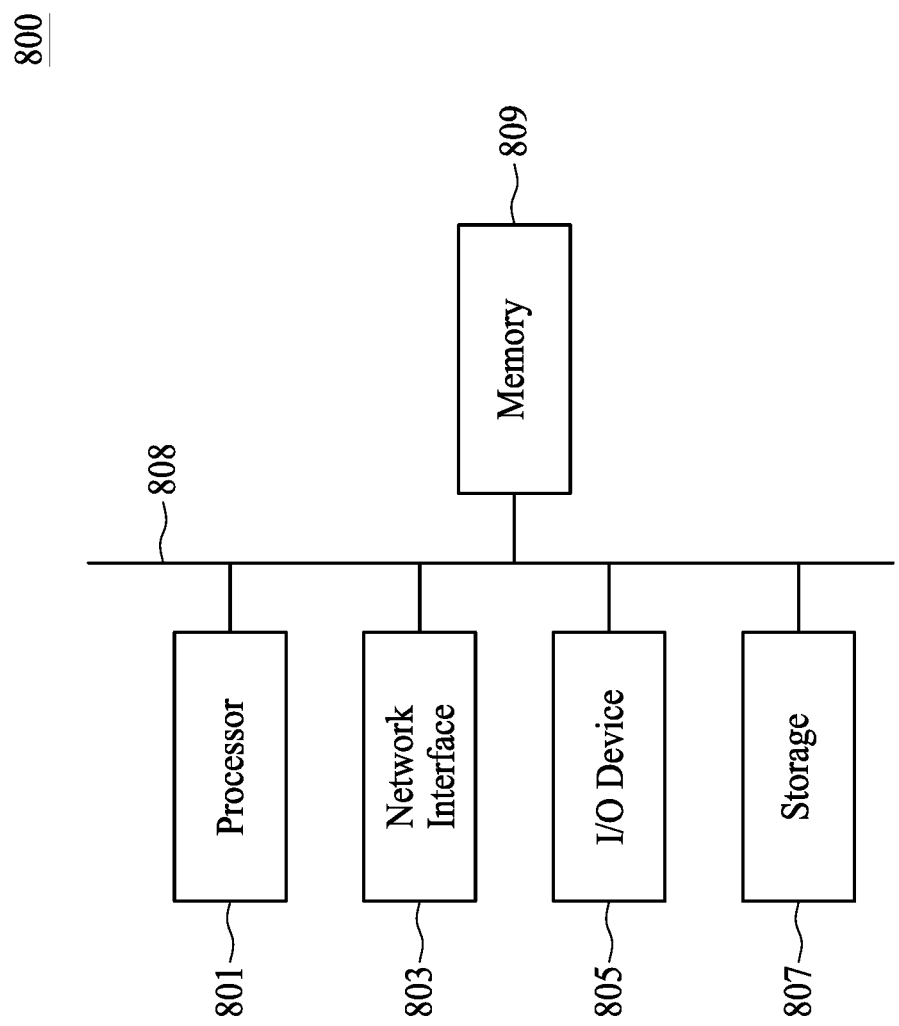
FIG. 8 is a schematic diagram of a system implementing a crystalline orientation angle estimation method, in accordance with some embodiments.

FIG. 8 is a schematic diagram of a system 800 implementing a crystalline orientation angle estimation method, in accordance with some embodiments. The system 800 includes one or more processors 801, a network interface 803, an input and output (I/O) device 805, a storage 807, a memory 809, and a bus 808. The bus 808 couples the network interface 803, the I/O device 805, the storage 807, the memory 809 and the processors 801 to each other.

The processor 801 is configured to execute program instructions that include a tool configured to perform the method as described and illustrated with reference to figures of the present disclosure. Accordingly, the tool is configured to execute the steps, such as estimating and providing crystalline orientation angles, and tuning parameters, e.g., the tilt angle of an implanter, of one or more semiconductor processing devices.

The network interface 803 is configured to access program instructions and data accessed by the program instructions stored remotely through a network (not shown).

The I/O device 805 includes an input device and an output device configured for enabling user interaction with the system 800. In some embodiments, the input device comprises, for example, a keyboard, a mouse, and other devices. The output device comprises, for example, a display, a printer, and other devices.

The storage device 807 is configured for storing program instructions and data accessed by the program instructions. In some embodiments, the storage device 807 comprises a non-transitory computer readable storage medium, for example, a magnetic disk and an optical disk.

The memory 809 is configured to store program instructions to be executed by the processor 801 and data accessed by the program instructions. In some embodiments, the memory 809 comprises any combination of a random access memory (RAM), some other volatile storage device, a read only memory (ROM), and some other non-volatile storage device.

According to an embodiment, a method includes: receiving a first wafer; defining a first zone and a second zone on the first wafer; defining a plurality of first areas and second areas for the first and second zones, respectively; projecting first ion beams onto the first areas and receiving first thermal waves in response to the first ion beams; rotating the first wafer by a twist angle; projecting second ion beams onto the second areas and receiving second thermal waves in response to the second ion beams; and estimating a first crystalline orientation angle of the first wafer based on the first and second ion beams and the first and second thermal waves.

According to an embodiment, a method includes: defining a first zone and a second zone on a first wafer; projecting first and second ion beams onto the first and second zones, respectively; estimating a first crystalline orientation angle of the first wafer based on the first and second ion beams; defining a third zone and a fourth zone on a second wafer; projecting third and fourth ion beams onto the third and fourth zones, respectively; estimating a second crystalline orientation angle of the second wafer based on the third and fourth ion beams; and estimating a third crystalline orientation angle of a third wafer based on the first and second crystalline orientation angles.

According to an embodiment, a method includes: receiving a plurality of wafers; estimating crystalline orientation angles of the plurality of wafers; classifying the plurality of wafers into wafer groups according to their crystalline orientation angles; selecting at least one wafer from one of the wafer groups; and performing an ion implantation operation on the at least one wafer according to a representative crystalline orientation angle of the one of the wafer groups.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a first wafer;
   defining a first zone and a second zone on the first wafer;
   defining a plurality of first areas and second areas for the first and second zones, respectively;
   projecting first ion beams onto the first areas and receiving first thermal waves in response to the first ion beams;
   rotating the first wafer by a twist angle;
   projecting second ion beams onto the second areas and receiving second thermal waves in response to the second ion beams; and
   estimating a first crystalline orientation angle of the first wafer based on the first and second ion beams and the first and second thermal waves.

2. The method according to claim 1, wherein projecting the first ion beams onto the first areas comprises projecting each of the first ion beams, at different times, onto each of the first areas and tilting the first wafer by respective first tilt angles, wherein the first tilt angles have an angular difference.

3. The method according to claim 1, wherein projecting the second ion beams onto the second areas comprises projecting each of the second ion beams, at different times, onto each of the second areas and tilting the first wafer by respective second tilt angles, wherein the second tilt angles are separated by a second difference value.

4. The method according to claim 1, wherein the twist angle is substantially 180 degrees.

5. The method according to claim 1, wherein estimating a crystalline orientation angle of the first wafer comprises measuring first intensities and second intensities of the first thermal waves and the second thermal waves, respectively.

6. The method according to claim 1, further comprising:
   receiving a second wafer and defining a third zone and a fourth zone on the second wafer, wherein the first wafer and the second wafer are manufactured from a same ingot;
   projecting third and fourth ion beams onto the third and fourth zones, respectively; and
   estimating a second crystalline orientation angle of the second wafer according to the third and fourth ion beams.

7. The method according to claim 6, further comprising:
   receiving a third wafer from the ingot; and
   estimating a crystalline orientation angle of the third wafer based on the first and second crystalline orientation angles.

8. The method according to claim 7, wherein the crystalline orientation angle of the third wafer comprises an arithmetic average of the first and second crystalline orientation angles.

9. The method according to claim 8, further comprising estimating an implantation angle of an implanter projecting the first and second ion beams based on the first and second ion beams and the first and second thermal waves.

10. The method according to claim 9, further comprising performing ion implantation on the third wafer according to the crystalline orientation angle of the third wafer and the implantation angle.

11. The method according to claim 1, wherein the first zone and the second zone have semicircular shapes.

12. The method according to claim 1, wherein the first areas comprise a first central area laterally surrounded by the remaining first areas and the second zone.

13. A method, comprising:
   defining a first zone and a second zone on a first wafer;
   projecting first and second ion beams onto the first and second zones, respectively;
   estimating a first crystalline orientation angle of the first wafer based on the first and second ion beams;
   defining a third zone and a fourth zone on a second wafer;
   projecting third and fourth ion beams onto the third and fourth zones, respectively;
   estimating a second crystalline orientation angle of the second wafer based on the third and fourth ion beams; and estimating a third crystalline orientation angle of a third wafer based on the first and second crystalline orientation angles.

14. The method according to claim 13, further comprising forming a semiconductive ingot and slicing the semiconductive ingot to form the first, second, and third wafers.

15. The method according to claim 13, wherein projecting first and second ion beams onto the first and second zones further comprises projecting one of the first ion beams onto a first area of the first zone and projecting one of the second ion beams onto a second area of the second zone, wherein the one of the first ion beams and the one of the second ion beams have identical energies and implantation angles.

16. The method according to claim 15, wherein the first area and the second area are symmetrical to a symmetry line of the first wafer.

17. A method, comprising:
receiving a plurality of wafers;
estimating crystalline orientation angles of the plurality of wafers, the estimating comprising projecting ion beams onto a first area and a second area of a first wafer with the first area and the second area being symmetrical to a symmetry line of the first wafer;
classifying the plurality of wafers into wafer groups according to their crystalline orientation angles;
selecting at least one wafer from one of the wafer groups; and
performing an ion implantation operation on the at least one wafer according to a representative crystalline orientation angle of the one of the wafer groups.

18. The method according to claim 17, further comprising estimating an implantation angle of an implanter that performs the ion implantation operation, wherein the ion implantation operation is performed according to the implantation angle.

19. The method according to claim 17, wherein the first wafer is a test wafer, wherein the estimating of the crystalline orientation angles of the plurality of wafers comprises estimating a crystalline orientation angle of the first wafer prior to estimating the crystalline orientation angles of the remaining wafers.

20. The method according to claim 19, wherein the estimating of the crystalline orientation angle of the first wafer further comprises projecting the ion beams onto the first area and a third area, different from the first area and the second area, with different wafer tilt angles.

* * * * *